(12) United States Patent
Wang et al.

(10) Patent No.: US 8,758,217 B2
(45) Date of Patent: Jun. 24, 2014

(54) PIEZOELECTRIC NANOWIRE VIBRATION SENSORS

(75) Inventors: Zhong L. Wang, Marietta, GA (US); Changshi Lao, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1467 days.

(21) Appl. No.: 12/202,849

(22) Filed: Sep. 2, 2008

(65) Prior Publication Data
US 2010/0056851 A1 Mar. 4, 2010

(51) Int. Cl.
H04R 25/00 (2006.01)
H01L 29/84 (2006.01)
H04R 31/00 (2006.01)
H04R 17/02 (2006.01)
H01L 41/113 (2006.01)

(52) U.S. Cl.
CPC .............. *H04R 31/006* (2013.01); *H04R 17/02* (2013.01); *H01L 41/1136* (2013.01); *H04R 25/60* (2013.01)
USPC ............................................ 600/25; 257/416

(58) Field of Classification Search
USPC ................ 600/25; 128/897; 73/570, 862.639; 607/55–57; 181/128–137; 381/23.1, 381/312–331; 257/415–420; 310/369, 310/313 R–313 D
See application file for complete search history.

(56) References Cited

U.S. PATENT DOCUMENTS

| | | |
|---|---|---|
| 2,769,867 A | 11/1956 | Crownover et al. |
| 3,594,514 A | 7/1971 | Wingrove |
| 5,569,968 A | 10/1996 | Lal et al. |
| 6,137,889 A | 10/2000 | Shennib et al. |
| 6,872,645 B2 * | 3/2005 | Duan et al. ..................... 438/584 |
| 6,940,989 B1 | 9/2005 | Shennib et al. |
| 2002/0012438 A1 | 1/2002 | Leysieffer et al. |
| 2002/0038072 A1 * | 3/2002 | Muller et al. .................... 600/25 |
| 2003/0185985 A1 * | 10/2003 | Bronikowski et al. ........ 427/258 |
| 2004/0114777 A1 | 6/2004 | Aubauer et al. |
| 2004/0179709 A1 | 9/2004 | Niederdraenk et al. |
| 2005/0064731 A1 * | 3/2005 | Park et al. ..................... 438/800 |
| 2006/0008111 A1 | 1/2006 | Nagaoka |
| 2006/0189841 A1 | 8/2006 | Pluvinage |
| 2006/0253278 A1 | 11/2006 | Furst-Yust et al. |
| 2008/0129278 A1 * | 6/2008 | Dai et al. ....................... 324/109 |
| 2008/0182424 A1 * | 7/2008 | Kuekes et al. ................ 438/755 |
| 2008/0264185 A1 * | 10/2008 | Kobayashi et al. ...... 73/862.637 |
| 2008/0314149 A1 * | 12/2008 | Rueger ............................ 73/579 |

FOREIGN PATENT DOCUMENTS

| | | |
|---|---|---|
| EP | 0144774 A2 | 6/1985 |
| WO | 9430030 | 12/1994 |
| WO | 9613869 | 5/1996 |
| WO | WO2007076254 A2 * | 7/2007 |

* cited by examiner

*Primary Examiner* — Catherine B Kuhlman
(74) *Attorney, Agent, or Firm* — Bryan W. Bockhop; Bockhop & Associates, LLC

(57) ABSTRACT

A vibration sensor includes a substrate. A first electrical contact and a spaced apart second electrical contact are both disposed on a first surface of the substrate. The elongated piezoelectric nano-scale structure extends outwardly from the first surface of the substrate and is disposed between, and in electrical communication with, the first electrical contact and the second electrical contact. The elongated piezoelectric nano-scale structure is oriented so that a voltage potential exists between the first electrical contact and the second electrical contact when the elongated piezoelectric nano-scale structure is bent from a first state to a second state.

9 Claims, 2 Drawing Sheets

PIEZOELECTRIC NANOWIRE VIBRATION SENSORS

BACKGROUND OF THE INVENTION

1. Field of the Invention

The present invention relates to vibration sensors and, more specifically, to a self-powered vibration sensor.

2. Description of the Prior Art

One out of ten people suffers from hearing loss. Such hearing loss ranges from mild impairment to complete deafness, both in children and adults. Hearing aid devices offer people with hearing loss a way to improve their hearing, thereby improving the quality of their lives. Typically, there are two categories of hearing loss, conductive hearing loss and sensorineural hearing loss (SNHL). For a conductive hearing loss, sound is not properly transmitted through the ear due to a structural defect. In such as situation, an amplifier may restore normal hearing.

The cochlea is the auditory portion of the inner ear and is filled with a watery liquid, which moves in response to the vibrations coming from the middle ear via the oval window. As the fluid moves, thousands of "hair cells" are set in motion and convert that motion to electrical impulses that are communicated to many thousands of nerve cells via neurotransmitters. The primary auditory nerve cells transform the auditory signals into electrical impulses known as action potentials. The action potentials travel along the auditory nerve to the brain, where they are perceived as sounds.

Cochlear hair cells in the inner ear serve as receptors for all auditory signals heard by the human ear. Essentially, each hair cell acts as a biological strain gauge. The vibration of the auditory signals applies a mechanical force on the hair cell, which opens an ion conducting channel in a cell membrane coupled to the hair cell. The flowing of ions through the channel result in an influx of current, which changes a potential associated with the membrane. The potential change affects the rate of release from the hair cell of a synaptic transmitter. Consequently, a pattern of action potentials which encode the auditory signals, including information such as intensity, time course and frequency, are transmitted to the brain via an afferent nerve fiber contacting the basolateral surface of the hair cell.

SNHL is often caused by the damage to the hair cells in the inner ear that are used to sense vibration, which causes a cochlear malfunction. One method of improving hearing in people with SNHL is through digital signal processing by pre-processing sound signals and amplifying certain frequencies. However, devices embodying this approach are of relatively large size and tend to have a high rate of power consumption.

Therefore, there is a need for a vibration sensor that mimics the function of hair cells, that is compact and that consumes relatively little power.

SUMMARY OF THE INVENTION

The disadvantages of the prior art are overcome by the present invention which, in one aspect, is a vibration sensor that includes a substrate. A first electrical contact and a spaced apart second electrical contact are both disposed on a first surface of the substrate. The elongated piezoelectric nano-scale structure extends outwardly from the first surface of the substrate and is disposed between, and in electrical communication with, the first electrical contact and the second electrical contact. The elongated piezoelectric nano-scale structure is oriented so that a voltage potential exists between the first electrical contact and the second electrical contact when the elongated piezoelectric nano-scale structure is bent from a first state to a second state.

In another aspect, the invention is a multi-frequency vibration sensor that includes a substrate having a first surface, a plurality of elongated piezoelectric nano-scale structures and an electrical detector. The plurality of elongated piezoelectric nano-scale structures extend outwardly from the first surface of the substrate. Each of the plurality of elongated piezoelectric nano-scale structures has a different length and each of the plurality of elongated piezoelectric nano-scale structures is oriented so as to generate a voltage potential when bent from a first state to a second state. The electrical detector is configured to detect the voltage potential generated by each of the plurality of elongated piezoelectric nano-scale structures.

In yet another aspect, the invention is a method of making a vibration sensor, in which a piezoelectric nanowire is grown from a substrate. Two spaced apart metal pads are coupled to the nanowire adjacent to the substrate. A voltage sensor is coupled to the spaced apart metal pads.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
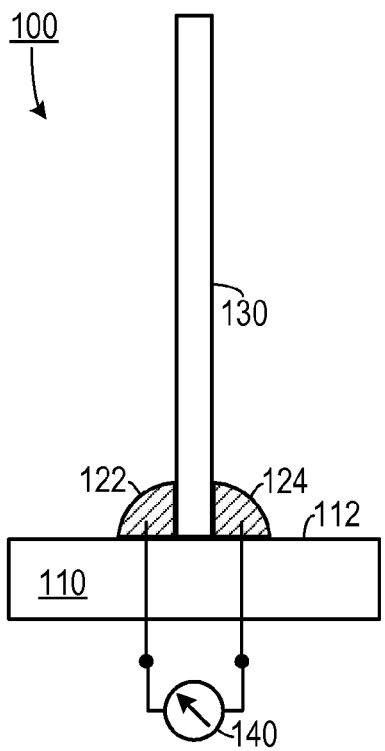
FIGS. 1A-1B is a cross-sectional view of a piezoelectric nanowire vibration sensor.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

U.S. Pat. Nos. 6,586,095 and 7,220,310 (both issued to Wang et al.) disclose methods of making nanowires that may be used in the embodiments disclosed below and, therefore, these patents are incorporated herein by reference.

In one embodiment, the invention is a vibration sensor employing at least one piezoelectric nanostructure, such as a nanowire. A hearing aid embodiment employs an array of different nanowires having different resonant frequencies.

A zinc oxide (ZnO) nanowire (or other nano-structure, such as a nanorod or nanobelt) is placed on a substrate so that part of the nanowire extends from the substrate into the surrounding environment. The nanowire is secured to the substrate by two metal pads, one on each side of the nanowire. The ZnO nanowire is piezoelectric so that if it is bent, it generates an electrical potential between the two metal pads. By sensing this electrical potential, the system can detect movement of the ZnO nanowire in a manner similar to the manner in which a hair cell (such as one inside the inner ear) detects motion (such as the vibration of air molecules when a sound is created).

The resonant frequency of the nanowire is a function of its length and thickness. An array of these nanowires, each having different length/thickness parameters, would be sensitive to the specific resonant frequencies corresponding to the different nanowires. For example, one could construct an array of nanowires that corresponds to an auditory bandwidth. Employing an array of nanowires with a high density of nanowires in a small area can result in a high level of sensitivity. ZnO nanowires can be grown into arrays with controlled lengths and diameters, so that a nanowire-based hearing aid can cover a large frequency range.

Recent research in nanopiezotronics has studied the piezoelectric-coupled properties of ZnO nanowires and nanorods for fabricating electronic components. Theoretical calculation has demonstrated that when a one-end fastened zinc oxide (ZnO) nanowire (or other nano-scale structure) vibrates, it will generate a detectable electric signal at the fastened bottom end of the nanowire. The vibration of a ZnO nanowire can be tuned by the outer signal strength and frequency. Also, the morphology of the ZnO nanowire such as length, thickness can affect the resonance frequency of a nanowire. Therefore, by detecting the electric signal generated from the nanowire vibration, the system can then mimic the ion current influx in a hair cell and membrane.

Figure 1B:
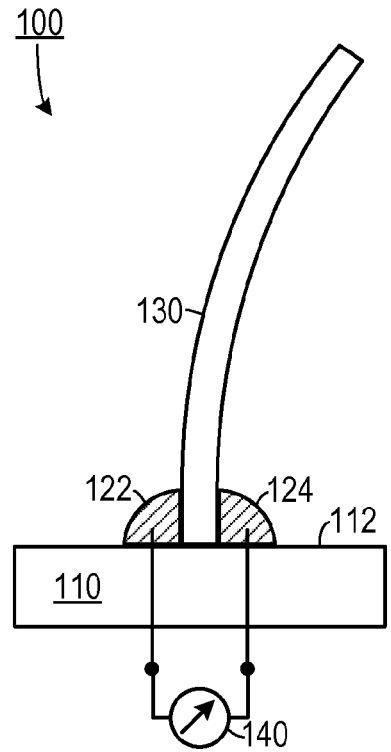

As shown in FIGS. 1A and 1B, one embodiment of a vibration sensor 100 includes a substrate 110, such as a silicon substrate, from which an elongated piezoelectric nano-scale structure 130 (for example, a zinc oxide nanowire) extends. A first electrical contact 122 and a spaced apart second electrical contact 124 are both disposed on a first surface 112 of the substrate 110 and are both in electrical communication with the base of the elongated piezoelectric nano-scale structure 130. The first electrical contact 122 and the second electrical contact 124 could both include, for example, metal pads.

An electrical detector 140 (for example, a voltage sensor) is configured to detect a voltage potential difference between the first electrical contact 122 and the second electrical contact 124 that is generated due to the piezoelectric effect when the elongated piezoelectric nano-scale structure 130 is bent from a first state, as shown in FIG. 1A, to a second state, as shown in FIG. 1B.

Figure 2:
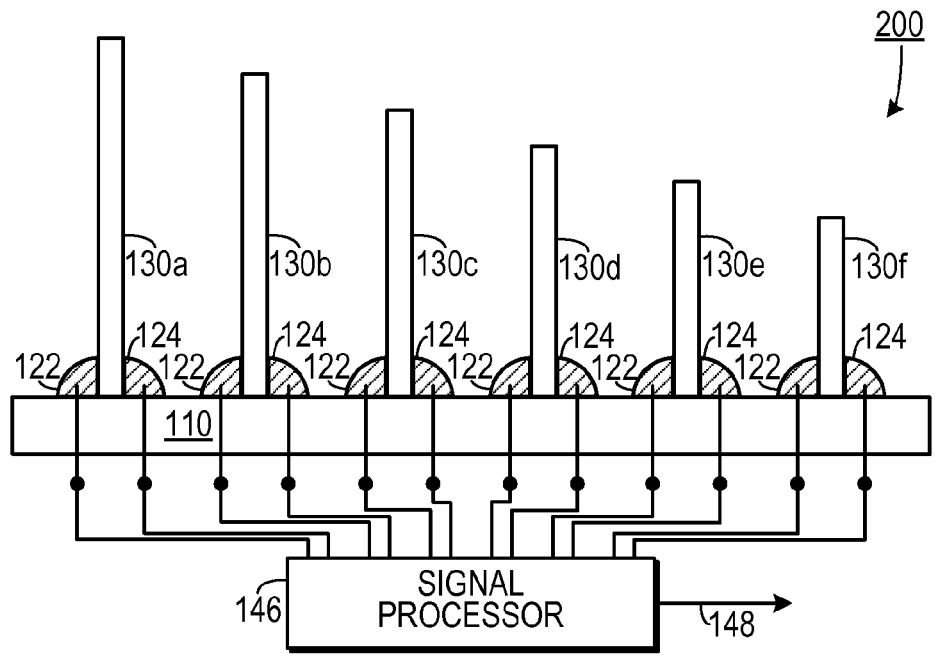
FIG. 2 is a cross-sectional view of an array of piezoelectric nanowire vibration sensors.

In one embodiment of a multi-frequency vibration sensor 200, as shown in FIG. 2, an array of elongated piezoelectric nano-scale structures 130a-f can extend from the substrate 110. Each of the of elongated piezoelectric nano-scale structures 130a-f can have a different length so that each is resonant with a different frequency component of a vibrating system. A signal processor 146 or a signal analyzer, which is responsive to each of the elongated piezoelectric nano-scale structures 130a-f then generates a signal 148 representative of the entire spectrum of vibration being sensed. This embodiment may be especially useful as a sensing element for a hearing aid.

Figure 3:
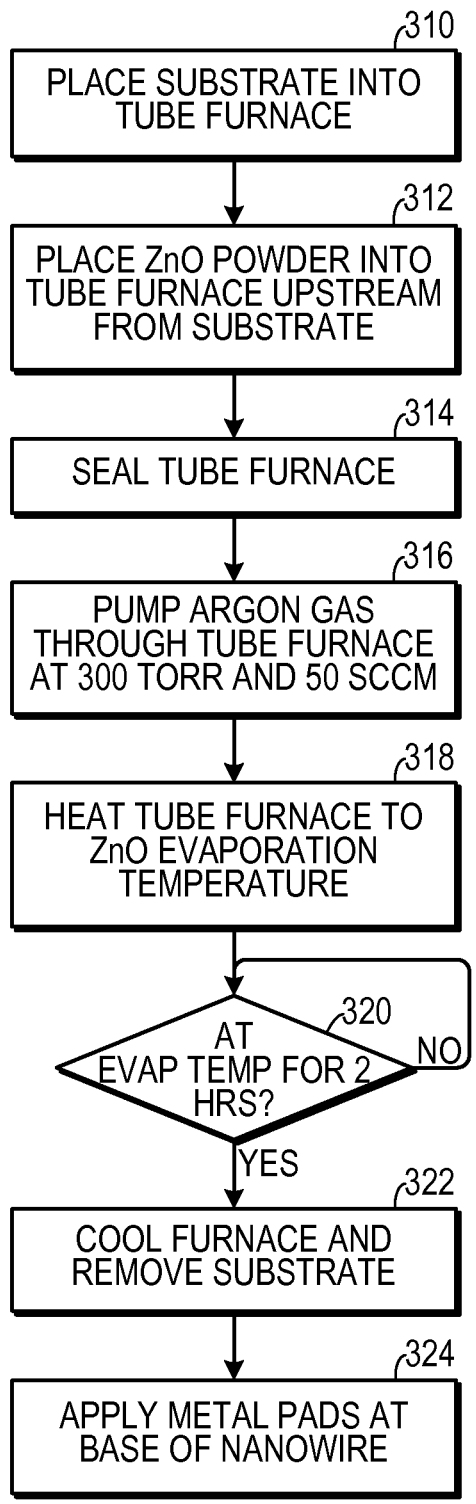
FIG. 3 is a flow chart demonstrating one embodiment of a method of making a piezoelectric nanowire vibration sensor.

In one embodiment of method of making a vibration sensor, a shown in FIG. 3, a substrate is placed into a tube furnace 310 and ZnO powder is place upstream of the substrate in the tube furnace 312. The furnace is sealed 314 and argon gas is pumped through the furnace at about 300 Torr and at about 50 SCCM 316. The furnace reaches a temperature corresponding to the evaporation temperature of ZnO and is maintained at that temperature for about two hours 320. The furnace is allowed to cool and the substrate is removed from the furnace 322. Metal pads are then applied to the bases of the nanowires 324, which may be done, for example, using an atomic force microscope.

In one embodiment, the vibration sensors disclosed herein mimic the mechanism of how a hair cell works, which potentially can be applied as an advanced category of hearing aid device option. Such sensors may find utility in many other types of applications, such as remote sound sensing systems.

This system offers several advantages, including: (1) Because the electric signal is generated from the nanowire vibration, it is a self power device. This eliminates a significant burden on the power source; (2) With the small and adjustable size of ZnO nanowires, they can easily be incorporated into the human cochlear system without affecting other functional hair cells in the ear; and (3) ZnO is biocompatible material The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A vibration sensor, comprising:
   a. a substrate having a first surface;
   b. a first electrical contact spaced apart from a second electrical contact, both disposed on the first surface of the substrate;
   c. an elongated piezoelectric nano-scale structure having a base directly affixed to the first surface of the substrate and grown therefrom and extending outwardly from the first surface of the substrate, and in electrical contact with, the first electrical contact and the second electrical contact, the elongated piezoelectric nano-scale structure oriented so that a voltage potential exists between the first electrical contact and the second electrical contact when the elongated piezoelectric nano-scale structure is bent from a first state to a second state; and
   d. a voltage sensor configured to detect the voltage potential between the first electrical contact and the second electrical contact that is generated due to a piezoelectric effect when the elongated piezoelectric nano-scale structure vibrates.

2. The vibration sensor of claim 1, wherein the elongated piezoelectric nano-scale structure comprises a nanowire.

3. The vibration sensor of claim 2, wherein the nanowire comprises a zinc oxide nanowire.

4. The vibration sensor of claim 1, wherein the first electrical contact and the second electrical contact both comprise a metal pad.

5. A multi-frequency vibration sensor, comprising:
   a. a substrate having a first surface;
   b. a plurality of elongated piezoelectric nano-scale structures extending outwardly from the first surface of the substrate, each of the elongated piezoelectric nano-scale structures having a base directly affixed to the first surface of the substrate and grown therefrom;
      each of the plurality of elongated piezoelectric nano-scale structures having a different length and each of the plurality of elongated piezoelectric nano-scale structures is configured to be resonant with a different frequency component of a vibrating system, each of the plurality of elongated piezoelectric nano-scale structures oriented so as to generate a voltage potential when bent from a first state to a second state; and c. an electrical detector configured to detect the voltage potential generated by each of the plurality of elongated piezoelectric nano-scale structures and configured to generate a signal representative of a spectrum of vibrations resonant with the plurality of elongated piezoelectric nano-scale structures due to a piezoelectric effect when the elongated piezoelectric nano-scale structures vibrate.

6. The multi-frequency vibration sensor of claim 5, wherein a first electrical contact is coupled to each of the plurality of elongated piezoelectric nano-scale structures and a second electrical contact is coupled to each of the plurality of elongated piezoelectric nano-scale structures so that the voltage potential exists between the first electrical contact and the second electrical contact.

7. The multi-frequency vibration sensor of claim 5, wherein each of the plurality elongated piezoelectric nano-scale structures comprises a nanowire.

8. The multi-frequency vibration sensor of claim 5, wherein each nanowire comprises a zinc oxide nanowire.

9. The multi-frequency vibration sensor of claim 5 configured as part of a hearing aid.

\* \* \* \* \*